United States Patent [19]

Park

[11] Patent Number: 5,558,381
[45] Date of Patent: Sep. 24, 1996

[54] CARRIER OPENER SYSTEM

[75] Inventor: Joon Park, Glendale, Calif.

[73] Assignee: Hughes Aircraft Co., Los Angeles, Calif.

[21] Appl. No.: 323,408

[22] Filed: Oct. 14, 1994

[51] Int. Cl.$^6$ ...................................................... H05K 13/00
[52] U.S. Cl. .................. 294/88; 294/94; 29/759
[58] Field of Search .................. 294/2, 64.1, 88, 294/93, 94, 116, 119.1; 29/759, 742; 414/416

[56] References Cited

U.S. PATENT DOCUMENTS

| | | | |
|---|---|---|---|
| 4,569,550 | 2/1986 | Harigane | 194/116 |
| 4,860,439 | 8/1989 | Riley | 29/759 |
| 4,883,300 | 11/1989 | Akagawa | 294/2 |
| 5,189,783 | 3/1993 | Hoon | 294/64.1 |
| 5,272,800 | 12/1993 | Rooney et al. | 29/759 |
| 5,284,413 | 2/1994 | Wilkinson et al. | 294/2 |

*Primary Examiner*—Dean Kramer
*Attorney, Agent, or Firm*—Leonard A. Alkov; Wanda K. Denson-Low

[57] ABSTRACT

The carrier opener system has a channel and guide pins for retaining and accurately positioning a carrier which has a component captured therein. A driver moves from a first to a second position and moves a carriage from a first to a second position where guide pins positively locate the carrier and release fingers enter the carrier. Motion of the driver from the second to the third position does not move the carrier, but moves the release fingers to engage in the carrier to uncaptivate the component for its subsequent removal. In this way, a carrier is accurately positioned and its component is precisely released.

16 Claims, 5 Drawing Sheets

5,558,381

CARRIER OPENER SYSTEM

FIELD OF THE INVENTION

This invention is directed to a mechanism for positioning and forcibly opening a carrier which retains an electronic component so that the electronic component is ready for removal from the carrier so that it can proceed to further processing and positioning on a printed wiring board.

BACKGROUND OF THE INVENTION

Many small electronic components are placed on a printed wiring board to create an electronic circuit. These electronic components include small discrete devices and/or multiple devices on a chip. Many different such devices are applied to the same printed wiring board and must be made available. There are systems with a plurality of storage tubes which each handle a carrier having a different electronic component thereon. These systems bring a selected carrier with its component to a predetermined position for further positioning of the electronic component.

It is very important that the carrier be precisely positioned when the carrier is opened to release its component. This is because the electronic component must be precisely positioned to be properly picked up by the next positioning device. The next positioning device may move the electronic device through inspection and preparation steps and may finally place it upon the printed wiring board. For exact handling of the electronic device, it must start from an exact position. Thus, precise positioning and careful opening of the carrier are necessary so that the carrier and the electronic devices are undamaged and the electronic device is exactly positioned and is freed by opening the carrier so that electronic device is available to be picked up and further positioned.

SUMMARY OF THE INVENTION

In order to aid in the understanding of this invention, it can be stated in essentially summary form that it is directed to a carrier opener system wherein the carrier is first positioned by guide rods entering into guide notches on the carrier. At the same time, fingers enter the carrier into spaces adjacent carrier retainer dogs. After the guide rods position the carrier and the opener fingers are in position, the opener fingers are spread to release the carrier retainer dogs from the electronic component.

It is, thus, a purpose and advantage of this invention to provide a carrier opener system which accurately positions and safely opens a carrier to release the electronic component retained thereby.

It is a further purpose and advantage of this invention to provide a carrier opener system wherein the carrier is first positioned by guide rods rising into guide notches and, at the same time, opening fingers extend into openings in the carrier followed by an opening movement of the opening fingers to release an electronic component previously held in the carrier.

Other purposes and advantages of this invention will become apparent from a study of the following portion of this specification, the claims and the attached drawings wherein:

DESCRIPTION OF THE PREFERRED EMBODIMENT

Figure 7:
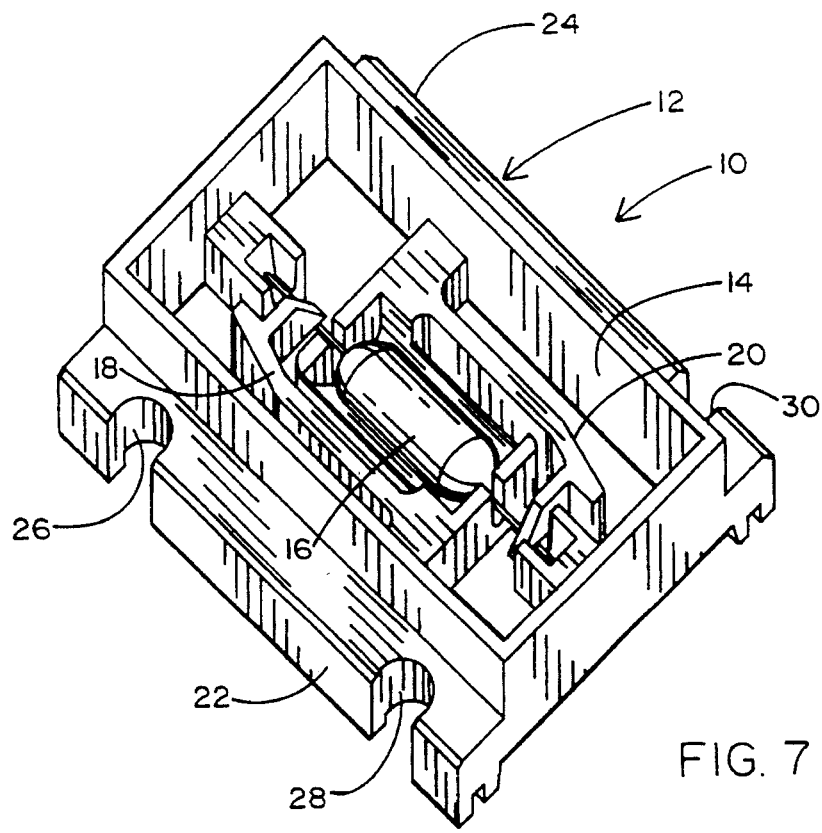
FIG. 7 is a perspective view of one of the carriers showing it holding an electronic component.
Figure 8:
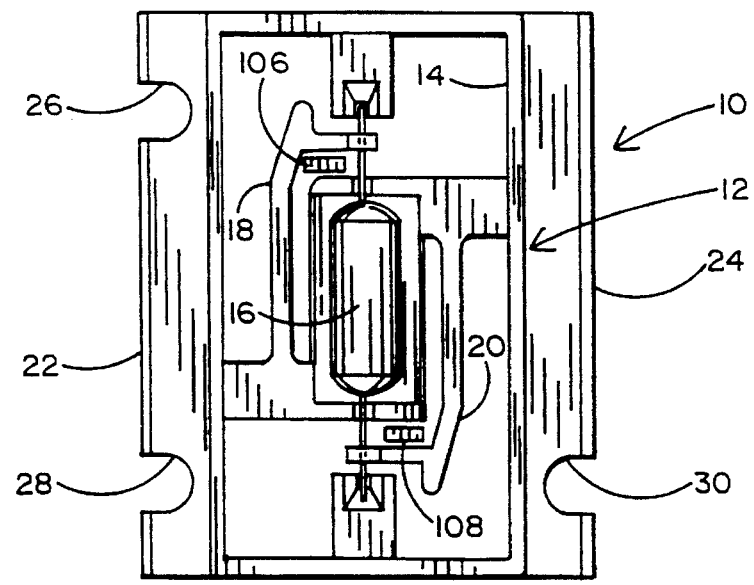
FIG. 8 is a plan view of the carrier of FIG. 7.

In order to understand the operation of the carrier opener system of this invention, an example of the electronic component carrier is generally indicated at 10 in FIGS. 7 and 8. The carrier 10 has a body 12 which has an interior recess 14. It is into this interior recess that a component 16 is inserted and retained. Different configurations of retention mechanism may be formed in accordance with the configuration of the component. As seen in top view in FIG. 8, the component 16 on carrier 10 is a component with axial leads, for example, a resistor. The component 16 is held in place with its axial leads in guide slots in the body 12. It is held in place by resilient fingers 18 and 20, which accurately locate the components in the body 12 until the fingers are released. The carrier has flanges 22 and 24 extending laterally from the main body 12. The flanges have guide notches therein for positioning of the carrier. The guide notches 26, 28 and 30 are seen in FIGS. 7 and 8. Since there are three guide notches with employment of three corresponding guide rods, the carrier is accurately positioned and oriented.

Figure 1:
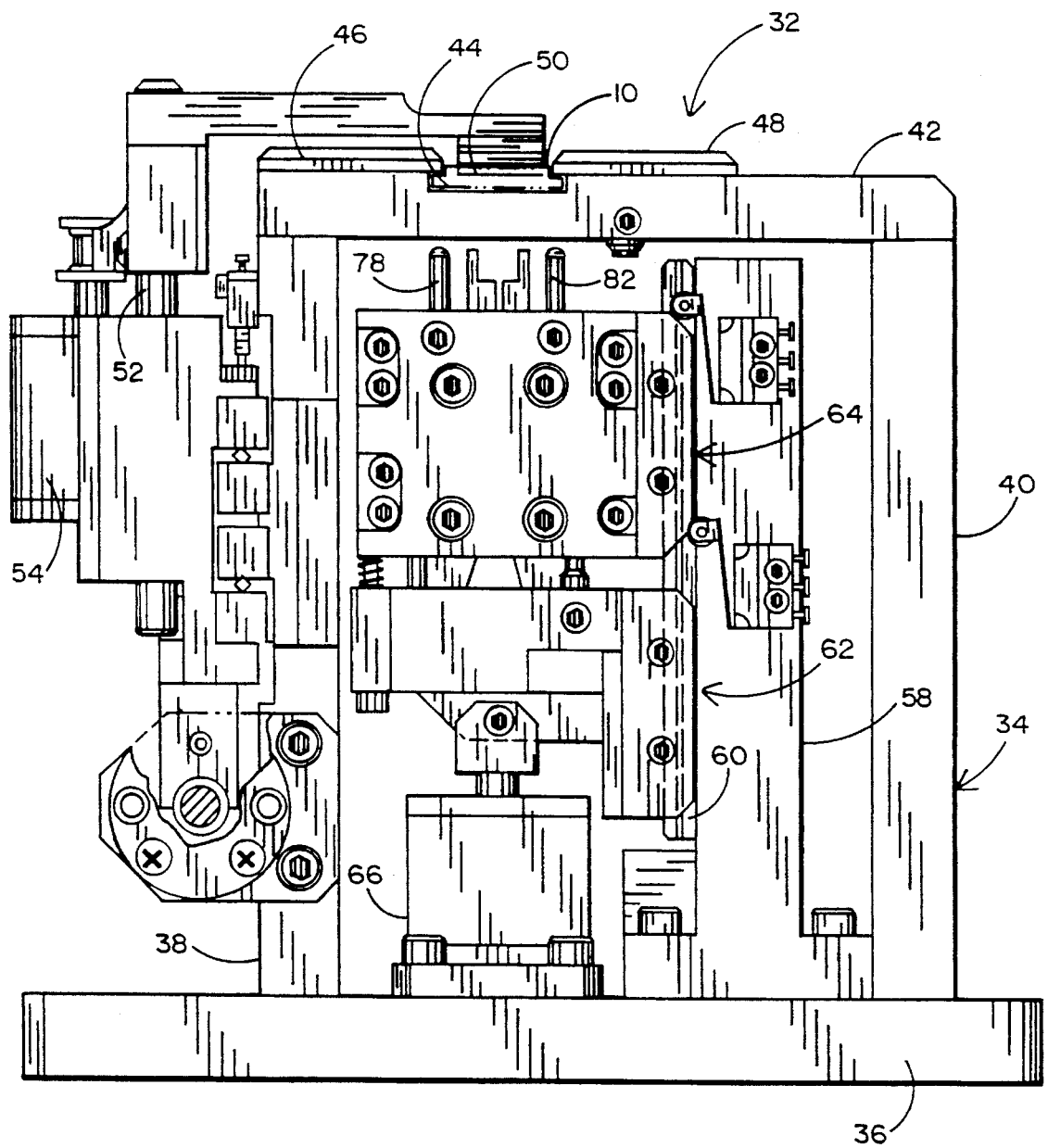
FIG. 1 is a side-elevational view of the carrier opener system of this invention in the inactive position.

The opener mechanism 32, shown in FIGS. 1, 2, 3 and 6, includes a frame 34. The frame has a baseplate 36 for securement in a suitable location with respect to the related positioning machines. The baseplate 36 carries upright frame members 38 and 40. Channel plate 42 is secured to the top thereof. Channel plate 42 has channel 44 therein which is sized to receive the carrier 10, as is shown in FIG. 1. The channel 44 is wide enough to receive the full width of both flanges on the body of the carrier. The channel plate 42 has two channel cover plates 46 and 48, which extend over the edges of the channel 44 just enough to cover the carrier flanges 22 and 24 on the sides of the body of the carrier. Thus, the carrier 10 can be placed into the channel 44 from one end and is constrained from rising by means of the cover plates 46 and 48 engaging over the carrier flanges 22 and 24.

Figure 2:
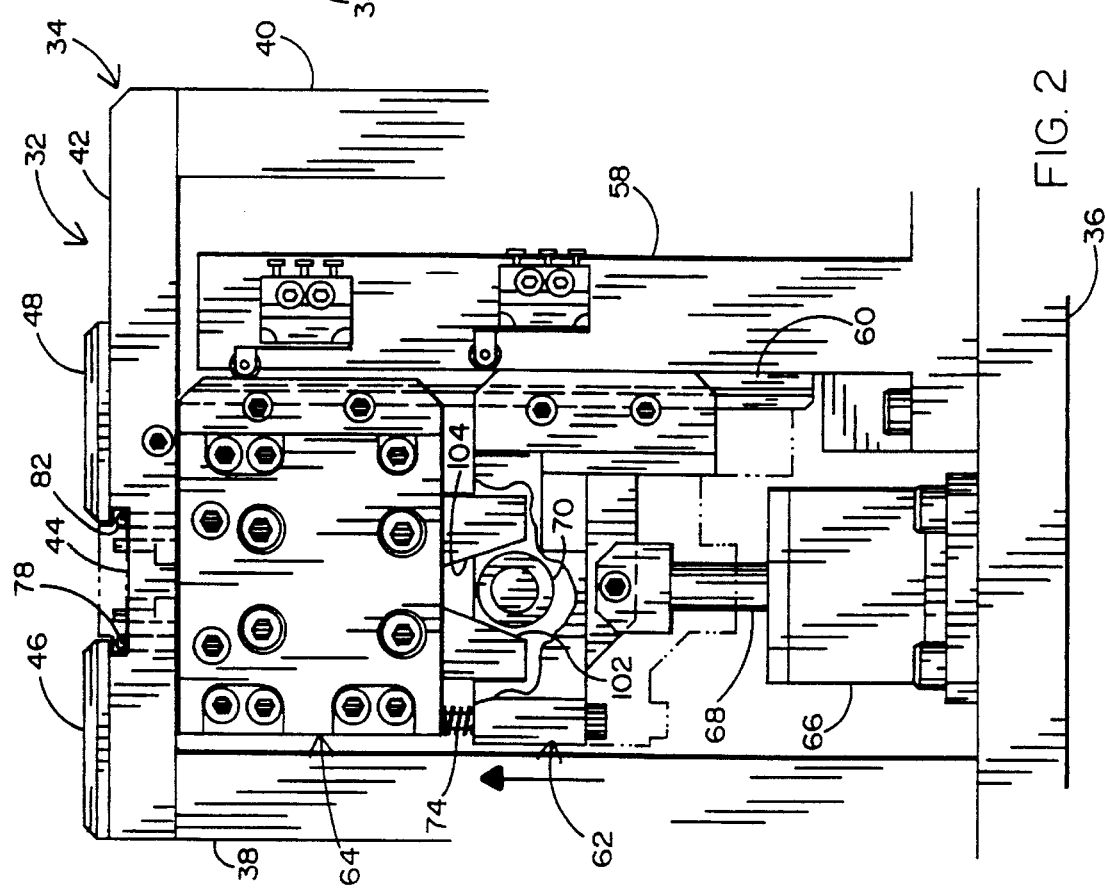
FIG. 2 is a side-elevational view, similar to FIG. 1, showing the carrier opener system in the second, carrier-locating position.
Figure 6:
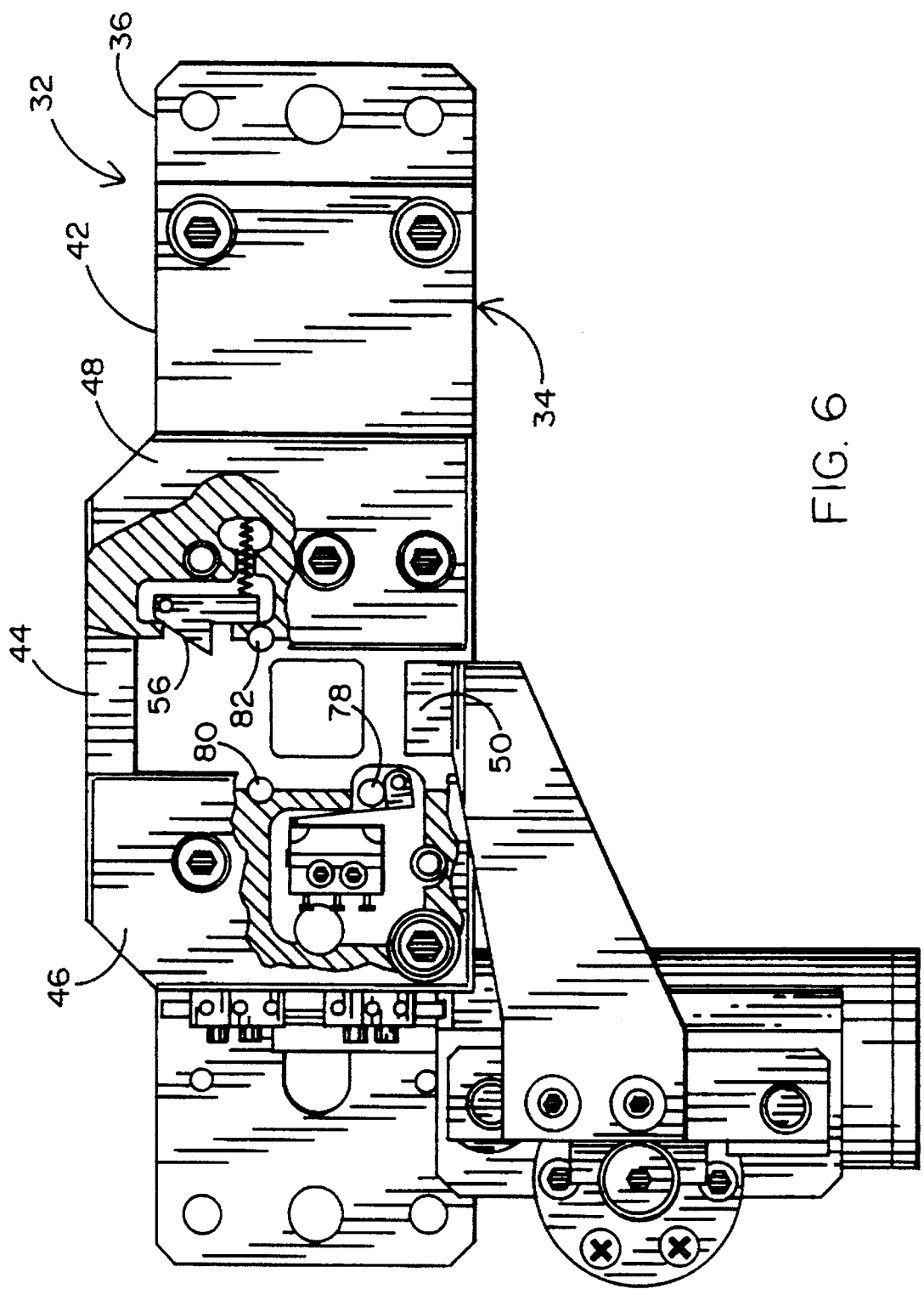
FIG. 6 is a plan view of the system, with parts broken away and parts taken in section.

By other mechanism, the carrier is thrust into the channel 44 from the top, as seen in FIG. 6. Stop 50 is mounted on stop guide shaft 52 (see FIG. 1) and can be moved upward out of the way by means of stop positioning air cylinder 54. The stop is in the down position in FIG. 1 when the carrier is thrust into the channel from the top of FIG. 6. This limits the position reached by the carrier. Pawl 56 is pivoted and spring-loaded beneath cover plate 48. It extends into the path of the carrier as it enters the channel and springs out behind the carrier as the carrier is thrust into position thereby captivating it. It prevents the return of the carrier out of the channel in the upward direction shown in FIG. 6. The carrier is thus restrained in position during the time it is acted upon by the carrier opener system. When operations on the carrier have been completed, stop 50 is raised above the channel and is moved upward (as seen in FIG. 2) then lowered downward to expel the carrier.

Figure 3:
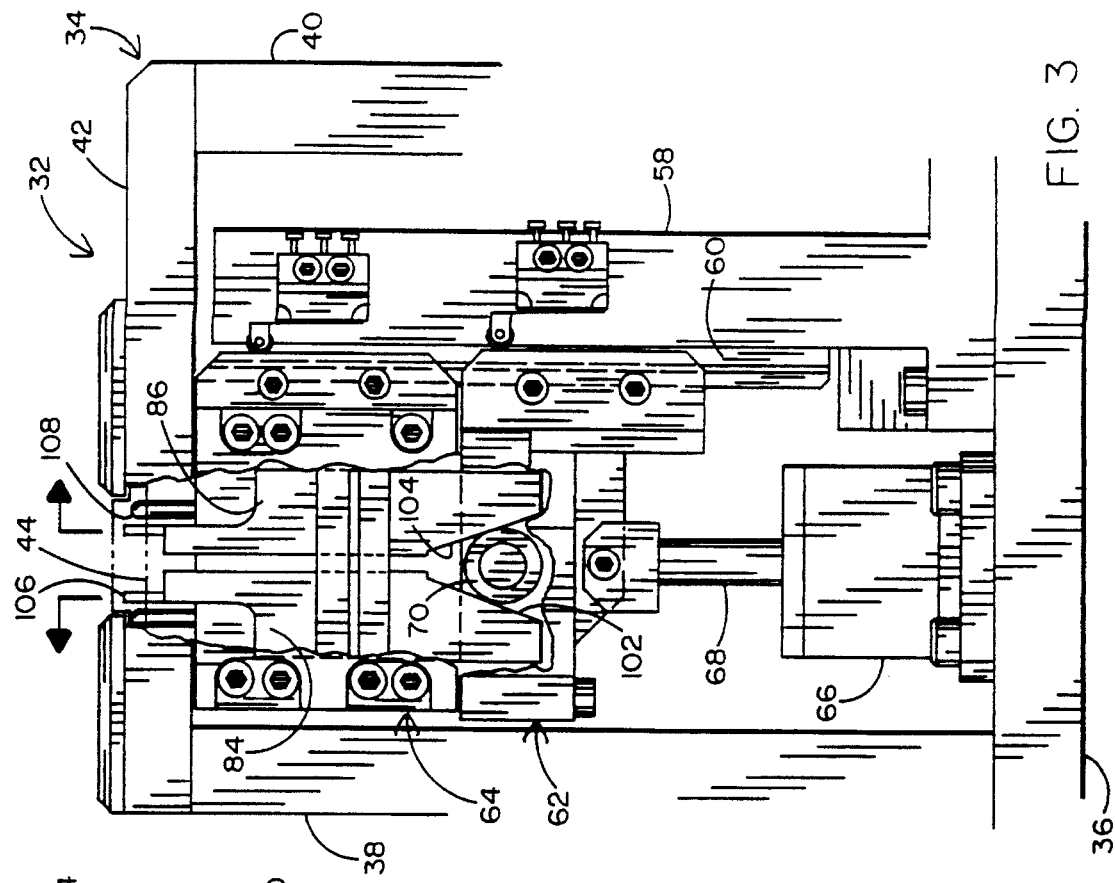
FIG. 3 is a view similar to FIG. 2, showing the carrier opener system in the carrier-open position.

Track carrier 58 extends upwardly from its securement on baseplate 36 and is parallel to upright frame member 40. The track carrier carries an upright track 60 thereon (see FIGS. 1, 2 and 3) which could be a linear ball bearing or other liner guideway. The track carrier 58 could be part of the upright 40. Both driver 62 and carriage 64 are mounted on track 60 for vertical motion therealong. Air cylinder 66 has its piston rod 68 directly connected to move the driver. The three positions of the driver are shown in FIGS. 1, 2 and 3. In FIG. 1, the driver is in its lowest position; in FIG. 2, the driver is in its intermediate position; in FIG. 3, the driver 62 is in its raised, highest position. The lowered position of FIG. 1 is the position in which the channel 44 is open for receipt of a carrier. A pair of cam rollers 70 and 72 is mounted on the driver 62. They are shown as being axially aligned in FIG. 5, and only the cam roller 70 is seen in FIGS. 2 and 3 because the other is behind. The cam rollers do not perform a function in the first and second positions of the driver.

Figure 5:
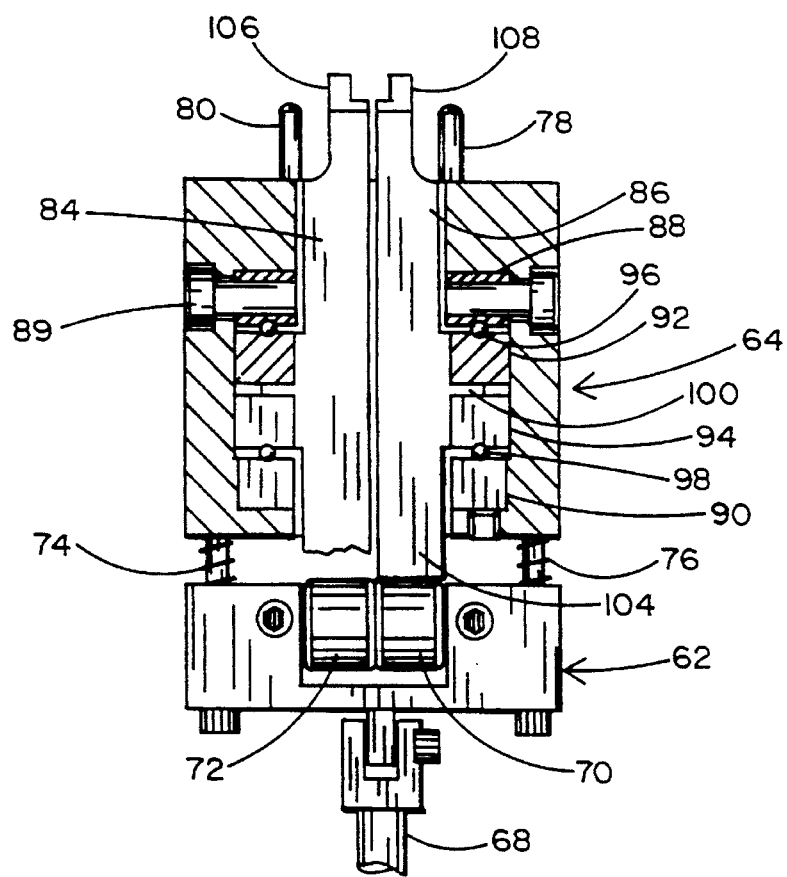
FIG. 5 is a side-elevational view of the opener mechanism, as seen generally along line 5—5 of FIG. 4.

Carriage 64 is supported on top of driver 62 by means of compression springs. Compression springs 74 and 76 are seen in FIG. 5, and compression spring 74 is seen in FIG. 2. The compression springs are strong enough so that they support the weight of carriage 64 as the driver 62 moves upwardly, as long as the carriage is not stopped.

Three guide pins 78, 80 and 82 are mounted on top of the carriage 64 and correspond to holes up into channel 44. As the carriage 64 is moved upward to the position shown in FIG. 2, the guide pins enter the channel 44. They enter the notches 26, 28 and 30 in the carrier to position the carrier precisely. FIG. 2 shows the second position wherein the carriage 64 is raised by upward motion of the driver 62 acting through the compression springs until the carriage 64 encounters the bottom of channel plate 42. Thus, in this position, the carrier is located precisely.

Figure 4:
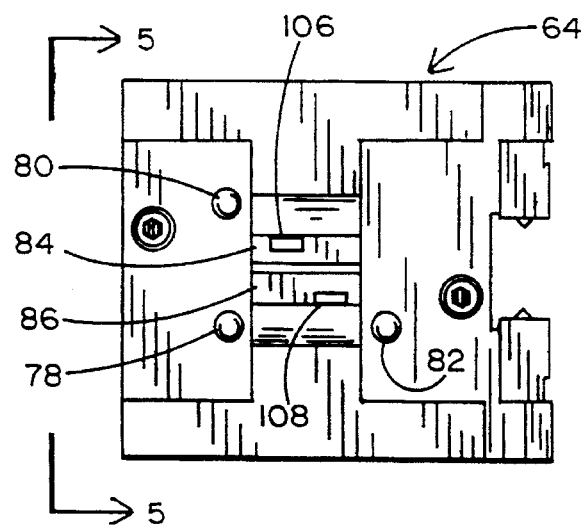
FIG. 4 is a plan view of the opener mechanism.

Operating members 84 and 86 (see FIGS. 4 and 5) are movably mounted in carriage 64. They are mounted for linear motion in a transverse direction to the up-and-down motion of carriage 64 on its vertical track. In order to provide low friction mounting, the operating members are mounted on linear ball bearings. Bearing races 88 and 90 are secured by machine screws such as machine screw 89 inside carriage 64, as seen in FIG. 5. Moving linear bearing races 92 and 94 are mounted on operating member 86. Bearing balls 96 and 98 are positioned between the races for anti-friction linear motion. Flange 100 extends from the side of operating member 86 to be embraced by the bearing races 92 and 94 to retain the operating member in alignment. The operating member 89 is mounted on its own set of linear ball bearings for motion parallel to operating member 86. As seen in FIGS. 4 and 5, the operating members are spaced from each other.

At the lower ends, the operating members 84 and 86 carry cam faces 102 and 104 (see FIG. 3). These cam faces are adjacent the cam rollers 70 and 72, respectively, In FIGS. 2 and 3, the near side of the driver 62 is broken away to expose these cam surfaces. In FIG. 5, the lower end of operating member 84 is broken away. If not broken away, it would extend on this side of the cam roller 72. As the driver 62 rises from its intermediate position in FIG. 2 to its upper position in FIG. 3, the carriage 64 is already at its top position and, thus, does not rise further. Instead, the cam rollers 70 and 72 engage upon the cam faces 104 and 102. As the driver 62 rises, this thrusts the operating members 84 and 86 apart from the position of FIG. 2 to the position of FIG. 3.

The operating members 84 and 86 respectively carry fingers 106 and 108 thereon. When the carriage 64 moves from its initial position in FIG. 1 to its intermediate position in FIG. 2, these fingers rise into the channel 44 at the same time the guide pins rise. They rise into position adjacent the arms 18 and 20 of the carrier, as seen in FIG. 8. Motion of the driver 62 from the second to the third position, from the position shown in FIG. 2 to the position shown in FIG. 3, causes spreading of the fingers 106 and 108 to release the retaining fingers 18 and 20 from their retention of the electronic component. The electronic component is now available to be picked up by a further handling machine. The fingers 106 and 108 can be positioned and configured so as to interact with any compatible carrier 10. Interchange of the mechanism cooperating with the carrier can be easily accomplished by simply removing carriage 64 and replacing it with another carriage having guide pins and actuating fingers suitable for that particular type of carrier. Thus, wide utility is achieved.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A carrier opener system comprising:

a frame;

walls in said frame defining a channel into which an electronic component retaining carrier can be inserted;

a carriage mounted in said frame, said carriage carrying guide pins thereon, said carriage being movable with respect to said frame toward said channel so that said guide pins enter said channel to position a carrier in said channel;

fingers on said carriage, said fingers being positioned to move into said channel when said guide pins move into said channel;

means to more said fingers with respect to each other to act upon a carrier in said channel to uncaptivate a component held by said carrier;

a driver movably mounted in said frame to move in the same direction as said carriage in said frame, said driver being connected to said carriage to move said carriage so that guide pins enter said channel, wherein said carriage is mounted on said driver to be resiliently moved by said driver so that said driver and said carriage move together from a first position wherein said guide pins are out of said channel to a second position wherein said guide pins are in said channel;

a stop for limiting motion of said carriage with respect to said frame when said driver moves said carriage to said second position wherein said guide pins are in said channel; and drive means for said driver to move said driver from a second position to a third position and said means to move said fingers includes cam faces actuated by movement of said driver from said second to said third position.

2. The system of claim 1 wherein said carriage includes first and second operating members and said fingers are on said first and second operating members, said first and second operating members respectively having first and second cam faces, said driver having a cam driver thereon for engaging said first and second cam faces to move said first and second operating members and said first and second operating fingers to uncaptivate the electronic component in the carrier.

3. The system of claim 2 wherein said operating members are mounted for linear motion within said carriage.

4. The system of claim 3 wherein said means for moving said driver comprises an air cylinder.

5. A carrier opener system comprising:

a frame, a channel in said frame for receiving a carrier which has index notches therein and which has a component therein which is captivated by retention fingers;

walls in said frame defining a channel into which an electronic component retaining carrier can be inserted;

a carriage movably mounted in said frame, said carriage having guide pins thereon and having release fingers thereon, said carriage being movable from a first position wherein said guide pins and said release fingers are away from said channel to a second position wherein said guide pins extend into said channel for engagement in the index notches in the carrier to precisely position the carrier and said release fingers are positioned to engage and move said retention fingers to uncaptivate the component in the carrier;

a driver mounted with respect to said frame, said driver being movable from a first to a second and to a third position, said driver being coupled to said carriage to move said carriage from its first position to its second position as said driver moves from its first position to its second position and said driver being coupled to said release fingers to move said release fingers from their unactuated to their actuated position upon movement of said driver from its second position to its third position so that motion of said driver from its first position to its third position positions the carrier and uncaptivates the component therein.

6. The system of claim 5 wherein there is a resilient connection between said driver and said carriage so that said resilient connection moves said carriage from its first position to its second position as said driver moves from its first position to its second position and said resilient connection is resiliently deflected as said driver moves from its second position to its third position while said carriage remains in its second position.

7. The system of claim 6 wherein said resilient connection is a compression spring.

8. The system of claim 5 wherein there are first and second operating members movably mounted on said carriage, said first and second operating members respectively carrying said first and second release fingers, said driver being connected to said first and second operating members to actuate said operating members as said driver moves from its second to its third position.

9. The system of claim 8 wherein said first and second operating members are mounted for linear motion on said carriage.

10. The system of claim 8 wherein there are first and second cam faces respectively on said first and second operating members and there is a cam actuator mounted on said driver so that said cam actuator is in contact with said cam faces to actuate said operating members as said driver moves from its second to its third position.

11. The system of claim 10 wherein said first and second operating members are mounted for linear motion on said carriage.

12. The system of claim 11 wherein said means to move said driver is a fluid motor.

13. The system of claim 11 wherein said operating members are mounted in said carriage on linear anti-friction bearings.

14. The system of claim 8 wherein both of said operating members are actuated at the same time by said driver so that said release fingers both move to uncaptivate the component.

15. The system of claim 14 wherein said carriage can be removed and a second carriage replaced therein for providing for a different configuration of guide pins and release fingers.

16. The system of claim 14 wherein said channel has cover plates over the edges so that a carrier is captured therein and is restrained from moving out of said channel by said guide pins.

* * * * *